United States Patent
Epperlein et al.

(10) Patent No.: US 10,983,897 B2
(45) Date of Patent: Apr. 20, 2021

(54) TESTING EMBEDDED SYSTEMS AND APPLICATION USING HARDWARE-IN-THE-LOOP AS A SERVICE (HILAAS)

(71) Applicant: INTERNATIONAL BUSINESS MACHINES CORPORATION, Armonk, NY (US)

(72) Inventors: Jonathan P. Epperlein, Dublin (IE); Claudio Gambella, Dublin (IE); Wynita M. Griggs, Maynooth (IE); Yassine Lassoued, Dublin (IE); Jakub Marecek, Dublin (IE); Martin Mevissen, Dublin (IE); Julien Monteil, Dublin (IE); Rodrigo H. Ordonez-Hurtado, Maynooth (IE); Giovanni Russo, Dublin (IE); Robert Shorten, Dublin (IE); Sergiy Zhuk, Dublin (IE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 404 days.

(21) Appl. No.: 15/883,290

(22) Filed: Jan. 30, 2018

(65) Prior Publication Data
US 2019/0235994 A1     Aug. 1, 2019

(51) Int. Cl.
*G06F 11/36*     (2006.01)
*G06Q 30/02*     (2012.01)
(Continued)

(52) U.S. Cl.
CPC ...... *G06F 11/3664* (2013.01); *G06F 11/3688* (2013.01); *G06F 11/3696* (2013.01);
(Continued)

(58) Field of Classification Search
CPC combination set(s) only.
See application file for complete search history.

(56) References Cited

U.S. PATENT DOCUMENTS

| | | |
|---|---|---|
| 7,016,811 B2 | 3/2006 | Peck et al. |
| 7,076,411 B2 | 7/2006 | Santori et al. |
| | (Continued) | |

FOREIGN PATENT DOCUMENTS

WO    2016173862 A1    11/2016

OTHER PUBLICATIONS

Thornton et al. "Internet-of-Things Hardware-in-the-Loop Simulation Architecture for providing Frequency Regulation With Demand Response". 1551-3203 © 2017 IEEE. 2017. 9 Pages. (Year: 2017).*

(Continued)

*Primary Examiner* — Eunhee Kim
(74) *Attorney, Agent, or Firm* — Griffiths & Seaton PLLC

(57) ABSTRACT

Embodiments for testing embedded systems and their applications in an Internet of Things (IoT) environment by a processor, denoted as a Hardware-in-the-Loop as a Service (HiLaaS). In a simulated environment, one or more simulated entities and one or more real entities in a networked system may be tested in real-time according to received control parameters, for a price. The price is estimated by the system, based on other parameters, and offered to the user to accept or reject. Alternatively, the user may specify the price, the system estimates control parameters, and the user can accept or reject the control parameters. One or more properties of the one or more entities, the network system, or combination thereof may be estimated based on the testing of the one or more simulated entities, when the price and control parameters are accepted.

24 Claims, 9 Drawing Sheets

(51) Int. Cl.
  *H04L 12/24* (2006.01)
  *H04L 12/26* (2006.01)
  *G06F 30/20* (2020.01)
(52) U.S. Cl.
  CPC ....... *G06Q 30/0283* (2013.01); *H04L 41/145* (2013.01); *H04L 41/147* (2013.01); *H04L 43/50* (2013.01); *G06F 30/20* (2020.01); *H04L 41/12* (2013.01)

(56) References Cited

U.S. PATENT DOCUMENTS

| | | | |
|---|---|---|---|
| 7,085,670 | B2 | 8/2006 | Odom et al. |
| 9,575,877 | B2 | 2/2017 | Ishigooka et al. |
| 10,567,469 | B1* | 2/2020 | Green .................... H04L 67/10 |
| 2015/0153757 | A1 | 6/2015 | Meagher |
| 2016/0125104 | A1 | 5/2016 | Waltrich |
| 2016/0147920 | A1 | 5/2016 | Goulkhah et al. |
| 2016/0321381 | A1 | 11/2016 | English et al. |
| 2017/0024500 | A1 | 1/2017 | Sebastian et al. |
| 2018/0062919 | A1* | 3/2018 | Justin .................... H04L 43/087 |
| 2018/0137525 | A1* | 5/2018 | Cotton .................... G06N 5/04 |
| 2018/0211337 | A1* | 7/2018 | Ghaddar ................ G06Q 50/30 |
| 2018/0300621 | A1* | 10/2018 | Shah .................... G06N 3/0445 |
| 2019/0296547 | A1* | 9/2019 | Kelly .................... G06F 11/30 |

OTHER PUBLICATIONS

Jaworki et al. "Microscopic Traffic Simulation Tool for Intelligent Transportation Systems". 2012 15th International IEEE Conference on Intelligent Transportation Systems. Anchorage, Alaska, USA, Sep. 16-19, 2012. (Year: 2012).*

Kleijn, "Introduction to Hardware-in-the-Loop Simulation," Control Lab, 2012 (15 pages).

* cited by examiner

TESTING EMBEDDED SYSTEMS AND APPLICATION USING HARDWARE-IN-THE-LOOP AS A SERVICE (HILAAS)

The project leading to this application has received funding from the Electronic Component Systems for European Leadership Joint Undertaking under grant agreement No 692455. This Joint Undertaking receives support from the European Union's Horizon 2020 research and innovation programme and Austria, Denmark, Germany, Finland, Czech Republic, Italy, Spain, Portugal, Poland, Ireland, Belgium, France, Netherlands, United Kingdom, Slovakia, Norway.

BACKGROUND OF THE INVENTION

Field of the Invention

The present invention relates in general to computing systems, and more particularly, to various testing embedded systems in an environment where a networked system is monitored using a variety of sensors connected in real-time, also known as the Internet of Things (IoT), and where some of the embedded systems are available in a manufactured form, while others are simulated on demand, denoted as Hardware-in-the-Loop as a Service (HiLaaS).

Description of the Related Art

In today's society, consumers, business persons, educators, and others use various computing systems in a variety of settings, many of which involve interconnection of the said systems. With the advent and further miniaturization of integrated circuits, computing systems can be integrated into a wide variety of personal, business, health, home, education, entertainment, travel and other devices. For example, vehicles of every kind are equipped with multiple computing systems. As the use of such data processing devices continue to proliferate throughout society, such devices are being relied upon. In order to have confidence in such devices and, especially, their interactions, testing the properties of such devices is critical.

SUMMARY OF THE INVENTION

Various embodiments for testing networked systems in an Internet of Things (IoT) environment are provided. In one embodiment, by way of example only, a method for testing embedded systems and application using Hardware-in-the-Loop as a Service (HiLaaS) by a processor in a computing environment is provided. The HiLaaS test comprises one or more real embedded systems tested alongside one or more simulated entities of one or more networked systems in real-time according to control parameters. The control parameters for the simulation may be received and/or defined to be tested in a simulation environment. The cost of the HiLaaS test may depend on the control parameters and the networked system. The output of the HiLaaS test may be estimates of one or more properties of the one or more entities, the network system, or combination thereof based on the testing of the one or more simulated entities.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
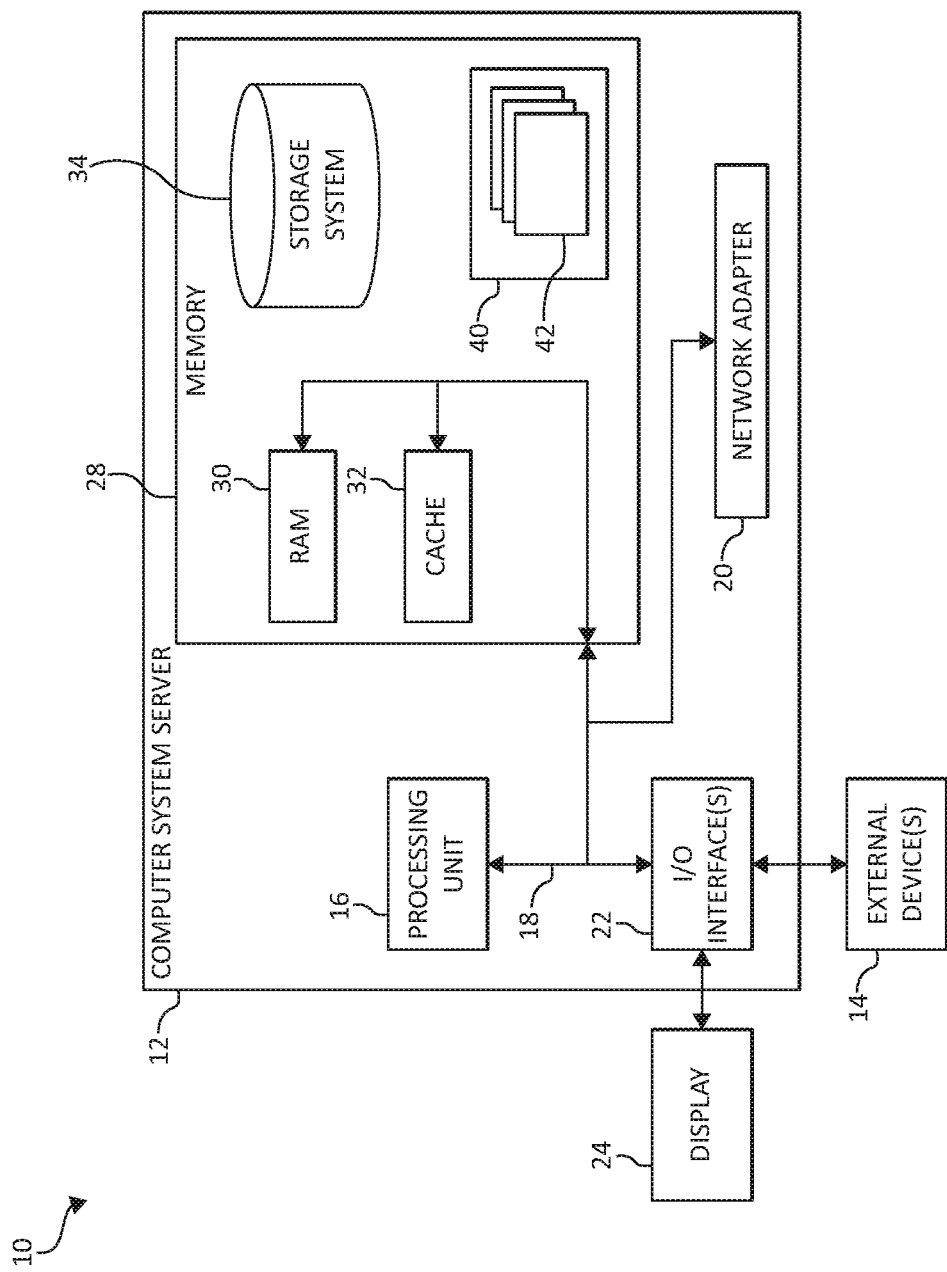
FIG. 1 is a block diagram depicting an exemplary computing node according to an embodiment of the present invention.

The advent of computers and networking technologies have made possible the intercommunication of people or devices from one side of the world to the other. For example, cloud computing may be provided as a service over the Internet, such as in the form of "Infrastructure as a Service" (IaaS), "Platform as a Service" (PaaS), and/or "Software as a Service" (SaaS). IaaS may typically provide physical or virtual computing devices and/or accessories on a fee-for-service basis and onto which clients/users may load and/or install, and manage, platforms, applications, and/or data. PaaS may deliver a computing platform and solution stack as a service, such as, for example, a software development platform, application services, such as team collaboration, web service integration, database integration, and/or developer community facilitation. SaaS may deploy software licensing as an application to customers for use as a service on demand. SaaS software vendors may host the application on their own clouds or download such applications from clouds to cloud clients, disabling the applications after use or after an on-demand contract expires.

In an additional aspect, the Internet of Things, also known as the Internet of objects, refers to the networked interconnection of everyday objects or the interconnection of computing devices (IoT devices). It is described as a self-configuring wireless network of sensors whose purpose would be to interconnect all things. The IoT devices may be uniquely identifiable and may communicate with one or more other IoT devices via computing networks to form device configurations. Multiple protocols, domains, and applications may be implemented in the IoT devices. IoT devices may be embedded in a variety of physical devices or products, such as home appliances, manufacturing devices, industrial printers, automobiles, thermostats, smart traffic lights, vehicles, buildings, etc. Further, IoT computing systems may include, for example, "demand response management" providing the ability to partially control a power load of residential customers such as, for example, where a power load may be remotely controlled. As an additional example, in the transportation industry, elements of an IoT computing system may include one or more types of vehicles.

However, current challenges impact various cloud computing and IoT computing systems. For example, in the IoT computing system it is difficult to deploy hundreds of thousands of sensors (e.g., "smart wires" and on-wire measurements of temperature) at a single time and it may be challenging to also foresee the benefits of the sensors from deploying only a few sensors in a proposed, pilot project. Thus, the present invention seeks to provide a solution to test embedded systems and application in an Internet of Things (IoT) network environment using Hardware-in-the-Loop as a Service (HiLaaS).

In one aspect, hardware in the loop may be applied in conjunction with simulation engines (e.g., simple simulation engines), with a fixed number of simulated elements, e.g., to testing an engine of a vehicle independent of the rest of the vehicle, while simulating the traction of 4 wheels and inputs from 1 driving wheel. In IoT applications, the numbers of simulated elements tend to vary and tend to be much larger, e.g., many thousand vehicles, and the precision of a result depends on the number of simulated elements. As such, the present invention provides that HiLaaS testing may apply to such networked systems, where the number of elements in the networked system under test changes over time. Accordingly, the mechanism of the illustrated embodiments may provide simulations of a networked system, where some actual or real elements can be instrumented to provide data in real-time, while a time-varying number of further elements may be simulated. For example, in a power system, the HiLaaS testing extends beyond merely testing a topology that may be constant over a time period (e.g., testing the impact of an outage of a power station), both to testing a topology that varies over time (e.g., optimal transmission switching) and to tests considering individual user interruptions (e.g., testing the individual interruptions of a power load caused by a user increasing or decreasing the power loads). As an additional example, the mechanism of the illustrated embodiments may provide the HiLaaS testing the transportation sector by simulating traffic using both global positioning satellites ("GPS") of actual, real vehicles and also time-varying the number of other vehicles (e.g., time-varying the number of other simulated vehicles in the traffic simulation test).

In one aspect, time-varying a number of entities for the HiLaaS testing of the networked system is critical for long term analysis. For example, the demand across many applications (e.g., power systems, transportation, networking) exhibits stationarity only when very short time periods (e.g., minutes) are considered. Thus, the present invention provides for a number of simulated entities to change in a non-stationary fashion to simulate an application or system over a selected time period (e.g., greater than or equal to 24 hours). The number of real entities may also change such as, for example, due to practical reasons (e.g., breakdowns, scaling up the simulations, etc.) if the simulation is to run for longer periods of time (e.g., years in the testing of road-safety of self-driving vehicles).

In one aspect, the frequencies of the events to simulate may be defined such as, for example, low frequency of event (e.g., 1 Hertz "Hz"), while the number of elements in the networked system may be large in size (e.g., thousands of elements). For example, in a transportation application, such as a speed advisory system for a ring-road or high-way of 54 kilometers ("km") with three thousand vehicles on the road, each vehicle may stay on the road for an hour, thus allowing for 1 Hz frequency of arrivals and departures of vehicles onto the road. In a city-scale speed advisory system, there may be a hundred thousand vehicles on the road network of 150 km at peak times, with 30 Hz frequency of the arrivals and departures. Further in transportation applications, vehicles may not be able to accelerate and decelerate arbitrarily fast, making the suggested frequency a realistic discretization of time for many other events as well.

The HiLaaS testing applied to an IoT computing system with networked systems may include testing interactions (e.g., non-linear interactions) of the elements (as compared to testing the number of the individual elements). For example, in deciding the speed of a vehicle, the speed of the said vehicle is set based on a number of factors comprising the speed of vehicles preceding and following in the same lane, as well as vehicles merging into the lane, and possibly vehicles in other lanes. Ideally, the speed advisory system considered in the example herein may consider all such factors, comprising the speed of all vehicles on a road, and set the speed for all vehicles on the road, jointly. As the connectivity and automation of the individual elements of a networked system improves, it may be possible to monitor and simulate the interactions, whereby the simulation accuracy increases.

To elaborate upon the speed advisory example, assume that in a selected geographical region such as, for example, region "A," a speed-advisory system is in operation, with input being the positions of some number of actual vehicles on the street. Traditionally, such systems are tested only in simulations, and then deployed to all users, such that all users have to react to a simulated test. In HiLaaS testing, the HiLaaS testing system may be deployed for one or more of the road users, and may simulate the behavior of other road users, while assimilating sensor data, such as the ramp metering data. One or more rules in the simulation environment may be defined such as, for example, the speed of a simulated vehicle cannot exceed the speed of the actual vehicle, whose position is input and assimilated, unless taking-over is simulated. Other rules, such as the compliance of the road users with the advised speed, may be an approximation. Still, the HiLaaS testing allows for estimating the properties of the network system, such as traffic density and its evolution over time, by considering the various interactions between both real and simulated.

As an additional example, in power systems, a drop in reported wind-speed may trigger a drop in demand for active power as large users of electric power (such as a company or organization) expect the price of power to increase. Such interaction can also be modelled in the HiLaaS testing. It should be noted that a large number of actual entities may be preferable in the HiLaaS test. In the transportation applications, if only a small number of actual vehicles provide their positions and a small number of actual vehicles are "adversarial", e.g., driving very slowly so as to intentionally try to create an impression of traffic congestion, the speed advisory system may provide sub-optimal recommendations. As a result, many drivers may re-route their trips, even if this would not be strictly necessary, in a large-scale deployment.

In order to test a large-scale networked system, high-performance computing (e.g., hundreds and/or thousands of compute-nodes) may be required for a selected period of time (e.g., short periods of time). While it may not be economical to purchase the high-performance hardware for the purposes of the test, HiLaaS testing provides access to the high-performance hardware "as a service" (e.g., as a service on demand), whereby the high-performance computing facilities are shared in a cloud computing environment.

In one aspect, the mechanisms of the present invention may use various simulation parameters (e.g., "inputs") into a simulation environment for the HiLaaS testing. The simulation parameters (e.g., "inputs") may include, but are not limited to, static data related to the network system (e.g., description and details of a power system, description and details of a transportation network, etc.), data for a selected time period (e.g., "per-day data" such as unit commitment schedule, a transportation timetable/schedule, calendaring data, etc.), real-time streamed data from the one or more entities and an environment associated with a networked system (e.g., a load of interruptible loads, positions of test vehicles), and information relating to the one or more entities (e.g., a type of simulation engine for HiLaaS testing, configuration of the HiLaaS testing, behavior of entities, or other user defined information).

Using the various simulation parameters or "inputs," the HiLaaS testing may estimate a number of entities to simulate and/or estimate interactions among the simulated entities, the real entities (e.g., non-simulated entities), and the environment of the networked system. The output of the HiLaaS testing of the networked system may provide real-time streamed data for the simulated entities and a forecast of the same data for the simulated entities for possible use in other applications. It should be noted that behavior of a network system may be forecasted for one or more reasons or motivations such as, for example, so as to set prices of services offered in real-time based on the forecast (e.g., forecast behavior of the network system to offer HiLaaS services at a selected price). The output of the HiLaaS testing of the networked system may also estimate one or more properties of the networked system based on the simulated entities and forecasts thereof.

Other examples of various aspects of the illustrated embodiments, and corresponding benefits, will be described further herein.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, system memory 28 may include at least one program product having a set (e.g., at least one) of program modules that are configured to vehiclery out the functions of embodiments of the invention.

Program/utility 40, having a set (at least one) of program modules 42, may be stored in system memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network vehicles, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
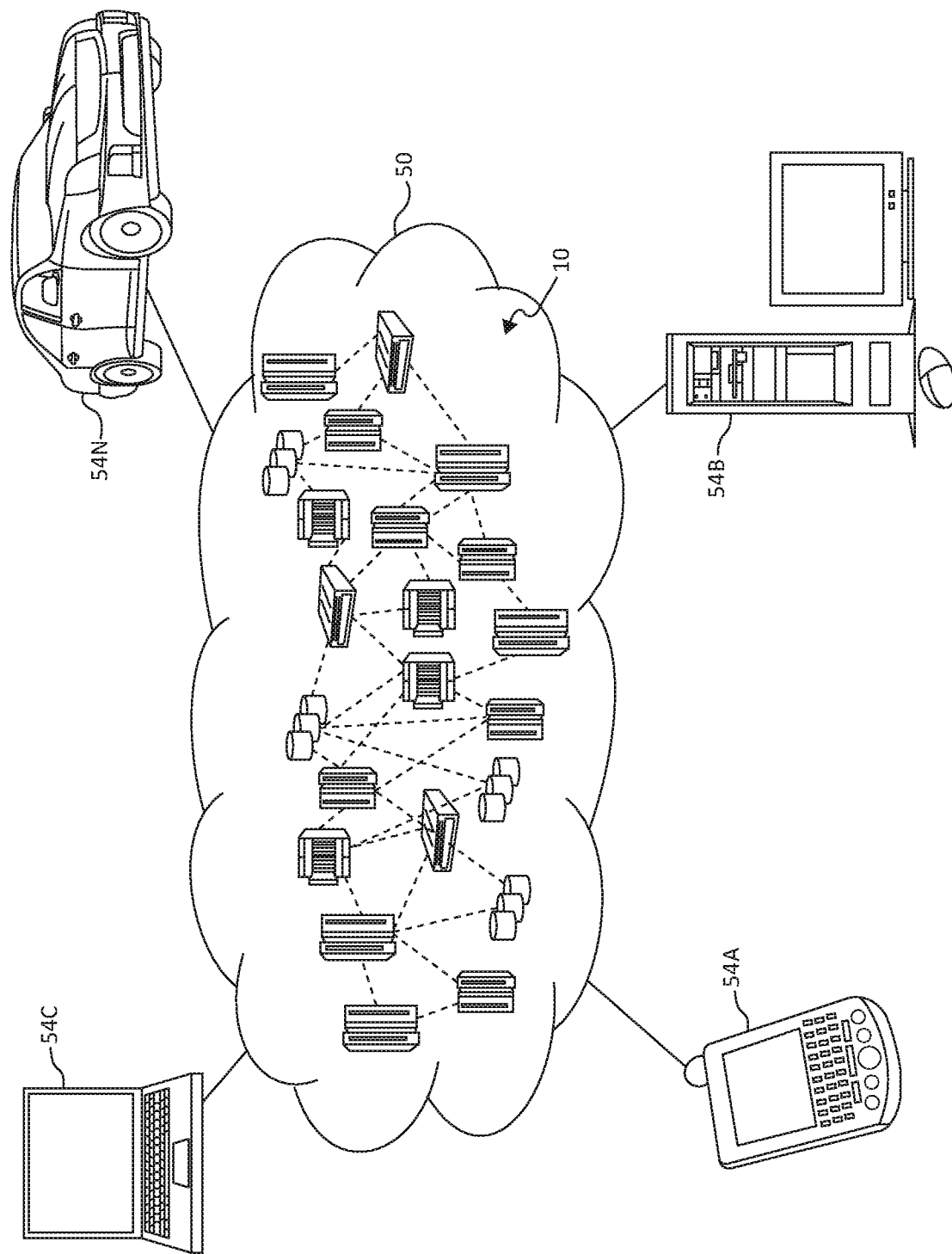
FIG. 2 is an additional block diagram depicting an exemplary cloud computing environment according to an embodiment of the present invention.

Referring now to FIG. 2, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
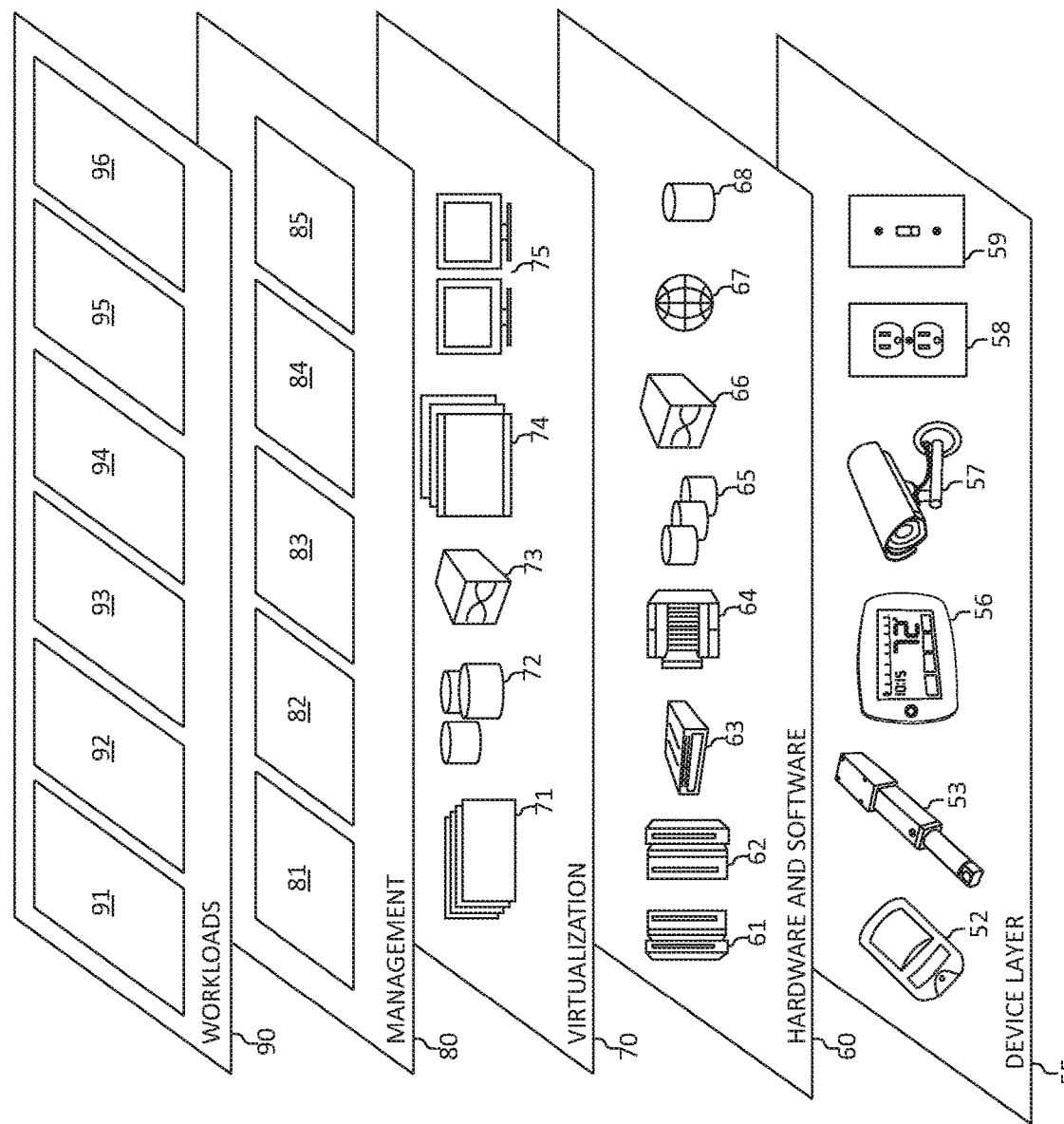
FIG. 3 is an additional block diagram depicting abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Device layer 55 includes physical and/or virtual devices, embedded with and/or standalone electronics, sensors, actuators, and other objects to perform various tasks in a cloud computing environment 50. Each of the devices in the device layer 55 incorporates networking capability to other functional abstraction layers such that information obtained from the devices may be provided thereto, and/or information from the other abstraction layers may be provided to the devices. In one embodiment, the various devices inclusive of the device layer 55 may incorporate a network of entities collectively known as the "internet of things" (IoT). Such a network of entities allows for intercommunication, collection, and dissemination of data to accomplish a great variety of purposes, as one of ordinary skill in the art will appreciate.

Device layer 55 as shown includes sensor 52, actuator 53, "learning" thermostat 56 with integrated processing, sensor, and networking electronics, camera 57, controllable household outlet/receptacle 58, and controllable electrical switch 59 as shown. Other possible devices may include, but are not limited to various additional sensor devices, networking devices, electronics devices (such as a remote control device), additional actuator devices, so called "smart" appliances such as a refrigerator or washer/dryer, and a wide variety of other possible interconnected objects.

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provides cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and, in the context of the illustrated embodiments of the present invention, various workloads and functions 96 for testing embedded systems and application using HiLaaS. In addition, workloads and functions 96 for testing embedded systems and application using HiLaaS may include such operations as data analytics, data analysis, and as will be further described, notification functionality. One of ordinary skill in the art will appreciate that the workloads and functions 96 for testing embedded systems and application using HiLaaS may also work in conjunction with other portions of the various abstractions layers, such as those in hardware and software 60, virtualization 70, management 80, and other workloads 90 (such as data analytics processing 94, for example) to accomplish the various purposes of the illustrated embodiments of the present invention.

As previously mentioned, the mechanisms of the illustrated embodiments provide novel approaches to test embedded systems and application using HiLaaS in a computing environment. Simulation parameters may be received and/or defined to be tested in a simulation environment using one or more real entities and one or more simulated entities. In the simulated environment, the one or more simulated entities of one or more entities and/or the real entities in a networked system may be tested in real-time according to the simulation parameters. One or more properties of the one or more entities, the network system, or combination thereof may be estimated based on the testing of the one or more simulated entities.

In one aspect, in the simulated environment, one or more simulated entities and one or more real entities in a networked system may be tested in real-time according to received control parameters, for a selected price (e.g., a price within a selected range, or below a pricing threshold). The price is estimated by the system, based on other parameters, and offered to the user to accept or reject. Alternatively, the user may specify the price, the system estimates control parameters, and the user can accept or reject the control parameters. One or more properties of the one or more entities, the network system, or combination thereof may be estimated based on the testing of the one or more simulated entities, when the price and control parameters are accepted.

In one aspect, the one or more entities may interact with each other and the environment associated with the networked system. The number of the simulated entities in the simulation environment may be adjusted or modified over a selected period of time. That is, the number of simulated entities over the selected period of time does not comprise samples from an identical distribution, but is influenced, selected, chosen, and/or even determined by real-time information from real entities (e.g., real-time streamed data from the real entities), as well as influenced, selected, chosen, and/or even determined by historical data and schedule data for a given day. Consider, for example, transportation applications. Traditionally, it may be expected that the number of vehicles on the road (e.g., a network or "road network") is sampled from a model of demand, which is either static or specific to each hour of the week. This number of vehicles may be adjusted, however, considering the input from the actual vehicles, such as the speed of the vehicles, and input from third-party sensors such as, for example, induction loops of a traffic control system or sensors measuring the amount of snow-fall. This may produce more accurate simulation.

In addition, the mechanisms of the illustrated embodiments may incorporate real-time feedback, which may be obtained from one or more users, the network system, the simulated entities and/or the real entities of the network system. For example, the feedback obtained may include real-time streamed data of the one or more real entities. In this way, the feedback information may also be used to vary, update, alter, and/or modify the various simulation parameters.

Additionally, the mechanisms of the illustrated embodiments provide a flexible "shared" service to serve multiple users, that may input data from multiple real elements of a networked system under test, sharing the data completely, partially, or not at all even within one application domain. Also, the mechanisms of the illustrated embodiments can serve a wide range of applications (for traffic simulations, e.g., acceleration advice, speed recommendation, routing advice, etc.) where each application relies on a particular combination of real, emulated, and/or simulated data and data exchanges. The real elements of the networked system under test can have full, partial, or no access to the virtual environmental data simulated in the simulation environment.

Figure 4:
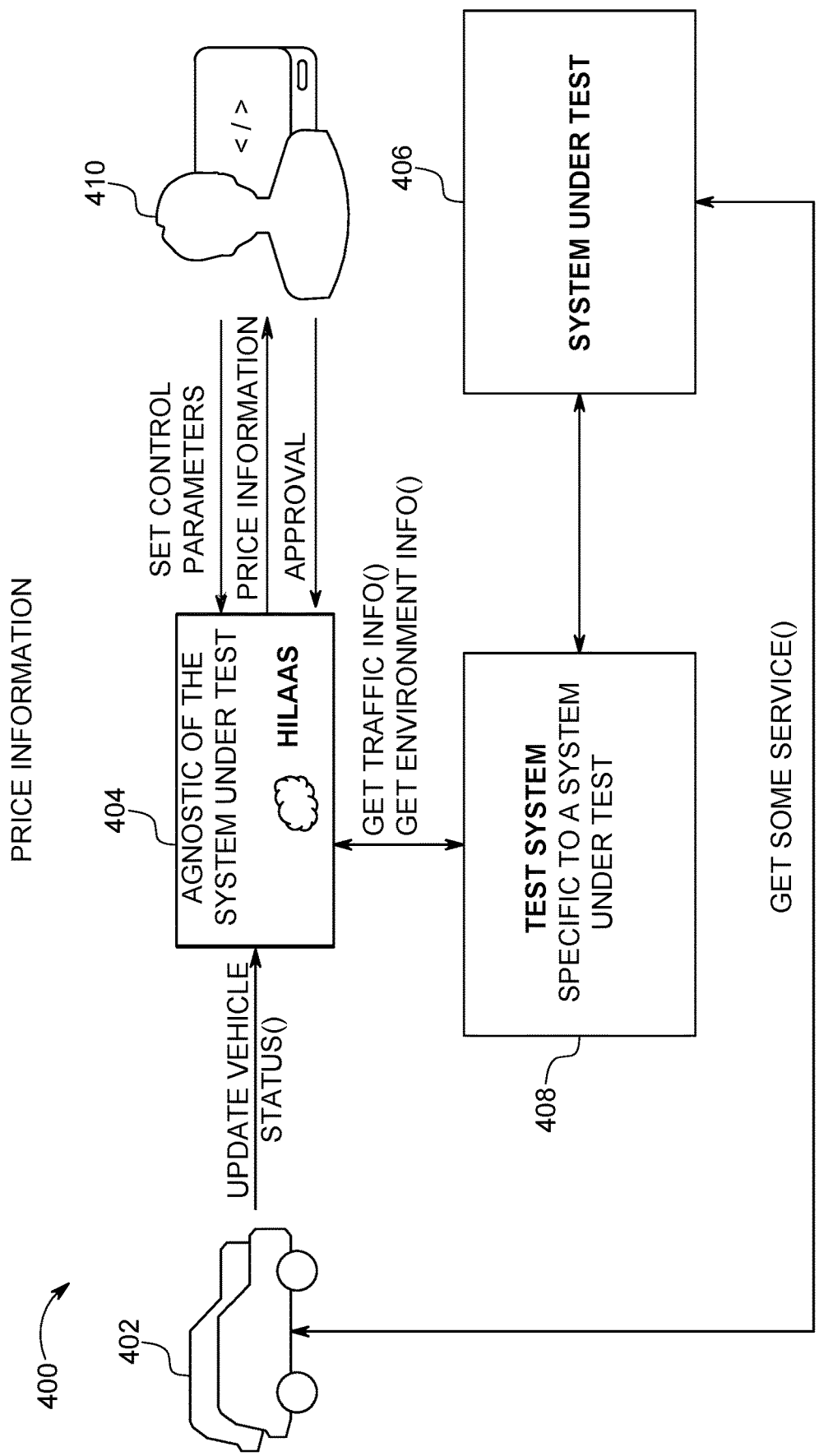
FIG. 4 is a diagram depicting an exemplary system for traffic simulation testing in an Internet of Things (IoT) computing network environment functioning in accordance with aspects of the present invention.

Turning now to FIG. 4, a diagram depicting an exemplary system for traffic simulation testing in an IoT network environment. FIG. 4 depicts a diagram of exemplary computing, data processing, sensory, testing embedded systems and applications using HiLaaS, and other components 400 shown in the context of a moving vehicle 402, in which various aspects of the present invention may be implemented. The various components 400 may work together in concert for testing embedded systems and application in an IoT network environment using HiLaaS.

As illustrated in FIG. 4, an example of simulating traffic of one or more vehicles 402 (e.g., IoT network entities) in a system under test 406 (e.g., simulation environment) using a test system 408 (e.g., a simulation engine) is depicted. That is, the one or more vehicles 402 may be tested in the system under test 406. However, the system under test 406 using the HiLaaS 404 (e.g., a HiLaaS interface 404) may be employed in a variety of contexts, scenarios, and/or other types of networked systems. As used herein, a "vehicle" may be an automobile, bicycle, hovercraft, scooter, bus, motorcycle, boat, ship, aircraft, plane, helicopter, drone, off road vehicle, truck, tractor, and/or other device used for movement or transportation. Additionally, a "vehicle" may be a virtual vehicle that may be used by system under test 406 for simulating one or more "real" or actual vehicles for testing in the system under test 406. In one aspect, one or more users such as, for example, user 410 may also be in communication with the HiLaaS 404 (e.g., a HiLaaS interface 404).

In one aspect, the vehicles 402 may be only one type of vehicle (e.g., only automobiles). Alternatively, the vehicles 402 may be a combination of types of vehicles (e.g., automobiles, motorcycles, busses, scooters, cyclists on a bicycle, etc.). Each of the vehicles 402 may include one or more types of IoT devices (e.g., IoT sensor devices) such as, for example, fuel consumption sensors, cameras, radio frequency identification "RFID" readers, biometric sensors, wearable sensors, computers, handheld devices (e.g., Global Positioning System "GPS" device or step counters), smartphones, and/or other sensor based devices.

In one aspect, the system under test 406 may be a speed advisory system, which sets the speed for vehicles 402 based on 1) positions of the vehicles 402, 2) real-time ramp metering data, and/or 3) further observations of demand (e.g., observations from a base station of a Global System for Mobile Communications ("GSM") network). For example, the observations of demand may be a number of vehicles intending to move from point A to point B. For varying the number of vehicles intending to move from point A to point B, one or multiple origin-destination ("OD") matrices may be used. Given the observations of demand may be time-varying and also conditional, other representations may be used for the vehicles.

The test system 408 may be used to test and validate one or more properties of the system under test 406. The test system 408 may be one or more simulator engines such as, for example, a micro-simulator of vehicular-traffic (e.g., Simulation of Urban Mobility ("SUMO"), a macroscopic simulator of vehicular traffic (e.g., based on a network of queues), a multi-model simulator ("MOVSIM"), a pedestrian simulator, and/or a cyclist simulator.

Moreover, the test system 408 uses the HiLaaS 404 to test a network system such as, for example, the system under test 406 in a simulation environment or "virtual" environment. The HiLaaS 404 may send data to the test system 408 and/or receive data from the test system 408. More specifically, the one or more vehicles 402 may provide real-time streamed data to the test system 408 via the HiLaaS 404.

As illustrated, the user 410 may send one or more control parameters to the HiLaaS 404 (e.g., the user may set the control parameters for the HiLaaS 404). For example, the user 410 may send via the HiLaaS interface 404 to the test system 408, one or more control parameters. The HiLaaS 404 may provide to the user pricing information for performing the testing. The user 410 may authorize and/or approve the price information.

Moreover, the one or more vehicles 402 may provide the HiLaaS 404 with a status update ("status( )") of information relating to the one or more vehicles 402 (e.g., position location, speed data, turn signal information, etc.). In turn, the test system 408 may receive traffic information (e.g., using a "get traffic info( )" function or "get environment info( )" function operation) from the HiLaaS 404 such as, for example, receiving data from a selected number of the one or more vehicles 402. The HiLaaS 404 may provide data relating to the real or "actual" vehicles of the one or more vehicles 402. Thus, the test system 408 may provide an "illusion" to a user by simulating the actual vehicles 402 in an actual environment.

Additionally, using one or more simulation parameters, the system under test 406 may indicate (as the output of the test) the behavior of one or more vehicles 402 such as, for example, the speed that each vehicle 402 should be traveling at each point in a trajectory, the direction each vehicle should be driven, or other output of the simulation parameters. Alternatively, the one or more vehicles 402 may retrieve from the system under test 406 specific information (e.g., "GetSomeService( )" function) relating to the simulation environment. In one aspect, by way of example only, the test system 408 comprises a traffic simulator in a transportation setting. The system under test 406 may be a speed advisory system. Thus, the test system 408 may be a simulator and the system under test 406 may be a system that is to be tested.

In operation, the test system 408 may consider a set of "scenarios" (which may include simulation parameters and rules) such as, for example, high-level, abstract situations, to validate some "safety properties" across all of the scenarios. For example, one scenario may test when two lanes merge into one following an incident. Each safety property can be described using a modal and temporal logic, which allows you to provide to HiLaaS 404 text language such as, for example, "no vehicles at any trajectory point may get closer than 10 centimeters of each other", while a user or entity may be reasoning about simulation parameters and rules including the vehicles 402 (e.g., velocity, acceleration, braking, etc.) and the system under test 406 (e.g., the speed advisory system).

In order to "instantiate" and make specific the "scenario", the HiLaaS 404 enables simulating the actual movements of each individual vehicle of the vehicles 402 for the system under test 406 "as if" 1) the speed advisory system was in place in the IoT network and 2) the "scenario" was in actual operation in the IoT network. Based on data about GPS-trajectories from a selected number of the vehicles 402 (whose drivers are made aware of the simulation scenario via audio or visual means such as, for example, projection on the wind shield), the test system 408 derives trajectories of other vehicles 402 (which are either completely virtual, or correspond to known arrivals to a road segment recorded by induction loops (e.g., a means of counting vehicles such as, for example, inductive-loop traffic detectors), and/or without further available data on the trajectory).

As a further explanation of the HiLaaS 404 and the test system 408, the HiLaaS 404 and the test system 408 may work in conjunction with each other, but the HiLaaS 404 may be agnostic of the system under test 406. The HiLaaS 404 may be a service that allows simulations to be run on a cloud computing system and real entities to be plugged or associate to the simulations of a simulation environment. The HiLaaS 404 may be application-independent. To test a specific application or service, a set of test cases and scenarios may be executed and evaluated, which may be the role of the test system 408. The test system 408 may be a system that runs specific scenarios (using the HiLaaS 404) related to an application and measures the success of the application in those scenarios.

The HiLaaS 404 may be related to a unit testing framework that allows tests to be executed, but is agnostic of the system under test, and the test system 408 may be related to the unit tests, which are specific for a given system under test and properties to be tested ("application"). For example, assume that a speed advisory system is tested for vehicles. The objective of the speed advisory system is to suggest optimum speeds for vehicles with the purpose to reduce pollution, while maintaining the traffic in "good conditions" for one or more reasons. To evaluate the impact of the speed advisory system on road safety, evaluate how well the speed advisory system is performing in different conditions, and/or to study the effect of the speed advisory algorithm parameters on the pollution and traffic congestion, the test system 408 may be provided, which has a set of predefined scenarios and parameters. The test system 408 may run simulations on the HiLaaS 404, possibly with one or more actual (or real) vehicles connected to the simulations, and the test system 408 monitors the results of the speed advisory system and effects on the overall traffic and pollution. The test system 408 can also analyze data coming from the real vehicles and drivers reflecting the satisfaction of drivers or the effect of the speed advisory on their behavior or vice-versa.

Figure 5:
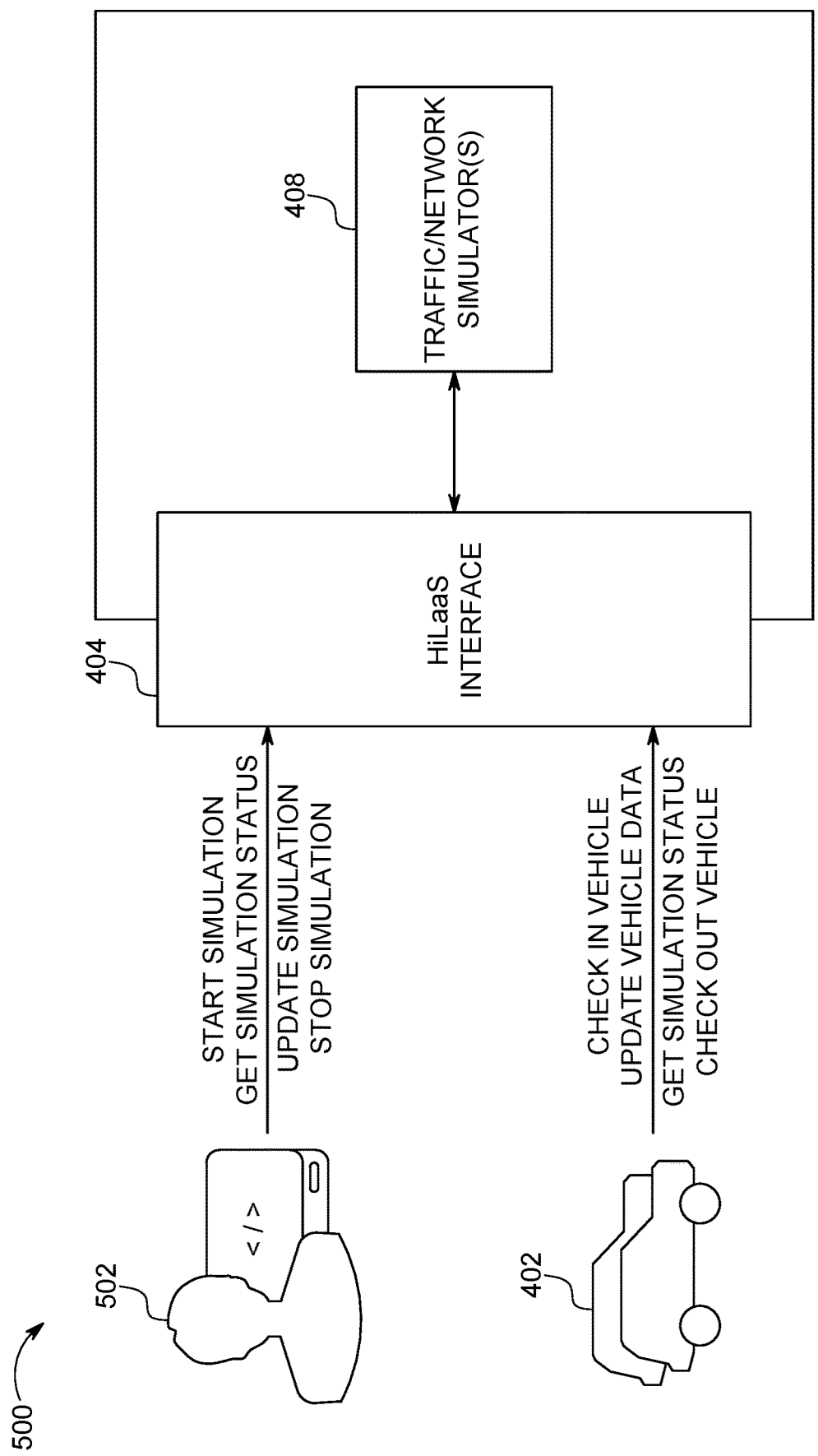
FIG. 5 is an additional diagram depicting an exemplary system for traffic simulation testing in an Internet of Things (IoT) computing network environment functioning in accordance with aspects of the present invention.

Turning now to FIG. 5, an additional example of simulating traffic of one or more vehicles 402 (e.g., IoT network entities) using a test system 408 (e.g., a simulation engine) is depicted. That is, FIG. 5 depicts exemplary computing, data processing, sensory, testing embedded systems and application using HiLaaS, and other components 500 shown in the context of the one or more vehicles in a traffic simulation. As will be seen, one or more aspects of FIGS. 1-4 may also be included with and/or implemented with FIG. 5. For example, components 500 may be included in and/or associated with computer system/server 12 of FIG. 1, incorporating one or more processing unit(s) 16 to perform various computational, data processing and other functionality in accordance with various aspects of the present invention. The various components 500 may work together in concert for testing embedded systems and application in an IoT network environment using HiLaaS.

As illustrated, the components 500 include a user 502, the one or more vehicles 402 of FIG. 4, the HiLaaS interface 404 (e.g., a HiLaaS Restful Application programming interface "API"), and one or more traffic/network simulator(s) such as, for example the test system 408 of FIG. 4. In one aspect, operations described in FIG. 4 between the user 410 and the HiLaaS 404 may also occur between the user 502 and the HiLaaS interface 404 (e.g., set control parameters, estimate/set pricing of the HiLaaS, and approve the pricing).

In operation, the user 502 may send one or more queries to the HiLaaS interface 404. For example, the user 502 may send via the HiLaaS interface 404 to the test system 408, a start simulation operation (e.g., a "StartSimulation" function), request a status update on the simulation (e.g., a "GetSimulationStatus" function), update the simulation (e.g., a "UpdateSimulation" function), and/or send a stop simulation command (e.g., a "StopSimulation" function).

The one or more vehicles 402 may also provide real-time streamed data to the HiLaaS interface 404. For example, the one or more vehicles 402 may send via the HiLaaS interface 404 to the test system 408 data to check in the one or more vehicles 402 (e.g., a "CheckInVehicle" function). Using the HiLaaS interface 404, the one or more vehicles 402 may also provide real-time streamed data that updates data of the one or more vehicles 402 (e.g., a "UpdateVehicleData" function), request a status update on the simulation (e.g., a "GetSimulationStatus" function), and/or send real-time streamed data to check out the vehicle (e.g., "CheckOutVehicle" function such as, for example, a function that stops considering the actual vehicle in the test system 408 and/or removes the vehicle from consideration from the test system 408).

In the context of the mechanisms of the illustrated embodiments, and as previously described using FIGS. 1-5, the follow examples are provided as sample use cases. It should be noted that other use cases may also be applicable.

In a first use case, assume a user desires to analyze the driving behavior of drivers in response to different types of parking real-time information and associated consequences over the state of current traffic conditions. The user may register for the service (e.g., HiLaaS service) and may be provided credentials. The user may be provided access to a Rest-based API (or other type) to use the HiLaaS interface. The user may create a simulation and may define one or more simulation parameters such as, for example, defining a specific scenario via configuration files (e.g., network selection, traffic state, number of parking spots, parking demand, etc.). The user may check in one or multiple real vehicles in the simulation. The user can update the vehicle data into the simulation, for instance, at each GPS position update. The user may update (in real-time or "on the fly") the simulation (e.g., changing the simulated vehicle routes "on the fly"), which may require an update of the configuration file(s). The user can retrieve the simulation status and has access to all the simulated vehicles' data. The user can retrieve the status of any vehicle. The user may also use an analytics service which makes use of the retrieved simulation and vehicle status and provides advice to the real driven vehicle(s). The reaction of the real vehicle(s) to the given recommendations may be stored (as historical data) for later analysis. The user checks out the vehicles and stops the simulations (e.g., the vehicles may be removed from consideration by the test system 408).

In a second use case, assume a user desires or intends to analyze a response of pedestrians to commercial routing advice in busy shopping streets, touristic cities, etc. so as to optimize customer satisfaction, a number of items purchased, comfort of walking, etc. The user may register for the service (e.g., HiLaaS service) and may be provided credentials. The user may be provided access to a Rest-based API (or other type) to use the HiLaaS interface. The user may create a simulation and may define specific scenarios via configuration files (e.g., area selection, street load, capacities of shopping stores, etc.). The user may check in one or multiple pedestrians in the simulation (e.g., pedestrians with GPS loggers). It should be noted that the cost of equipping pedestrians is low (e.g., an application may be used on a computing device that a user may download to the computing device). The user can update the pedestrian data into the (micro-)simulation, for instance, at each GPS position update. The user may update (in real-time or "on the fly") the simulation such as, for example, changing the simulated pedestrian routes on the fly, which may require an update of the configuration file(s). The user may update (in real-time or "on the fly") the simulation (e.g., changing the simulated vehicle routes "on the fly") and have access to all the simulated pedestrian data. The user can retrieve any vehicle status in particular, e.g., information about specific vehicle types. The user may also use an analytics service which makes use of the retrieved simulation and pedestrian status and gives advice to the equipped pedestrians. The reaction of the pedestrians to the given recommendations (and their impact on the pedestrian traffic) may be analyzed. The user may also use an analytics service. The user may check out the pedestrians from the simulation and stop the simulation.

In a third use case, assume a user desires to investigate a cyclist's behavior in response to routing advice such as, for example, pollution avoidance, or to optimize covered areas in the event of adverse weather conditions. The user may register for the service (e.g., HiLaaS service) and may be provided credentials. The user may be provided access to a Rest-based API (or other type) to use the HiLaaS interface. The user may create a simulation and may define one or more simulation parameters such as, for example, defining a specific scenario via configuration files (e.g., area selection, origin-destination matrices or other means of modelling the demand for transportation, traffic state, weather conditions, etc.). The user may check in one or multiple cyclists in the simulation such as, for example, cyclists with GPS loggers. It should be noted that the cost of equipping cyclists is low, such as, for example, by providing the cyclists with an application installed onto a mobile device (e.g., smartphone or other computing device), considering the wide spread of mobile phones capable of running third-party applications. The user can update the cyclists' data into the (micro-) simulation, for instance, at each GPS position update. The user may update, in real-time or "on the fly," the simulation such as, for example, changing the simulated cyclist's routes or weather conditions on the fly. The user may retrieve the simulation status and has access to all the simulated cyclist's data, as well as pollutant concentration data generated by vehicle traffic on the cyclist's routes. The user may retrieve a cyclist status (e.g., the cyclist status of those corresponding to a cyclist type). The user may also use an analytics service, which makes use of the retrieved simulation data and cyclist's status and gives advice to the real cyclists. The reaction of the cyclists to a given recommendation may be analyzed. The user is able to check out the cyclists from the simulation and stop the simulation.

Figure 6:
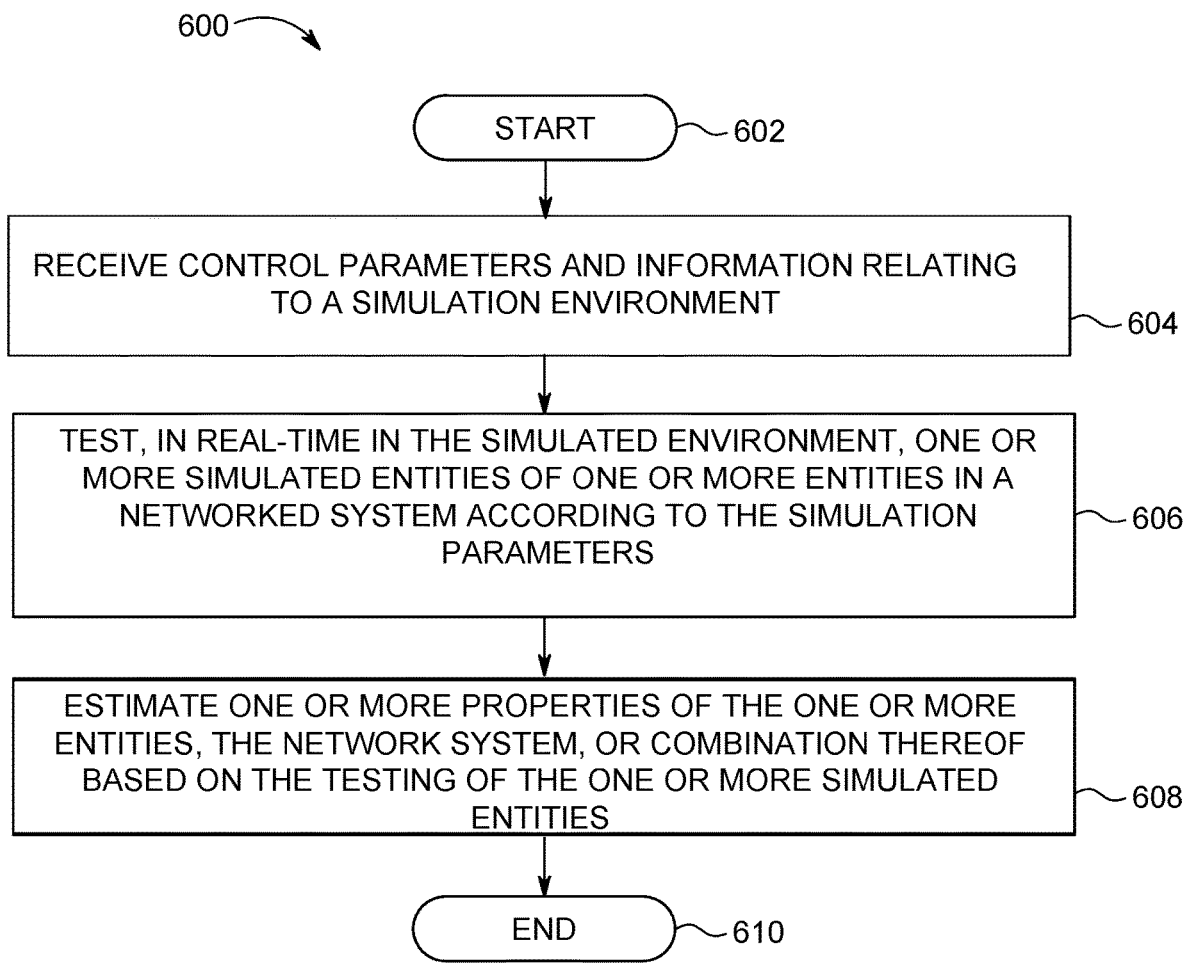
FIG. 6 is a flowchart diagram depicting an exemplary method for testing embedded systems and application in an Internet of Things (IoT) computing network environment using Hardware-in-the-Loop as a Service (HiLaaS), again in which various aspects of the present invention may be implemented.

Turning now to FIG. 6, a method 600 for testing embedded systems and application in an Internet of Things (IoT) network environment using Hardware-in-the-Loop as a Service (HiLaaS) by a processor is depicted, in which various aspects of the illustrated embodiments may be implemented. The functionality 600 may be implemented as a method executed as instructions on a machine, where the instructions are included on at least one computer readable medium or one non-transitory machine-readable storage medium. The functionality 600 may start in block 602. Control parameters and information relating to a simulation environment may be received, as in block 604. In the simulated environment, one or more simulated entities of one or more entities in a networked system may be tested in real-time according to the simulation parameters, as in block 606. One or more properties of the one or more entities, the network system, or combination thereof may be estimated based on the testing of the one or more simulated entities, as in block 608. The functionality 600 may end, as in block 610.

Figure 7:
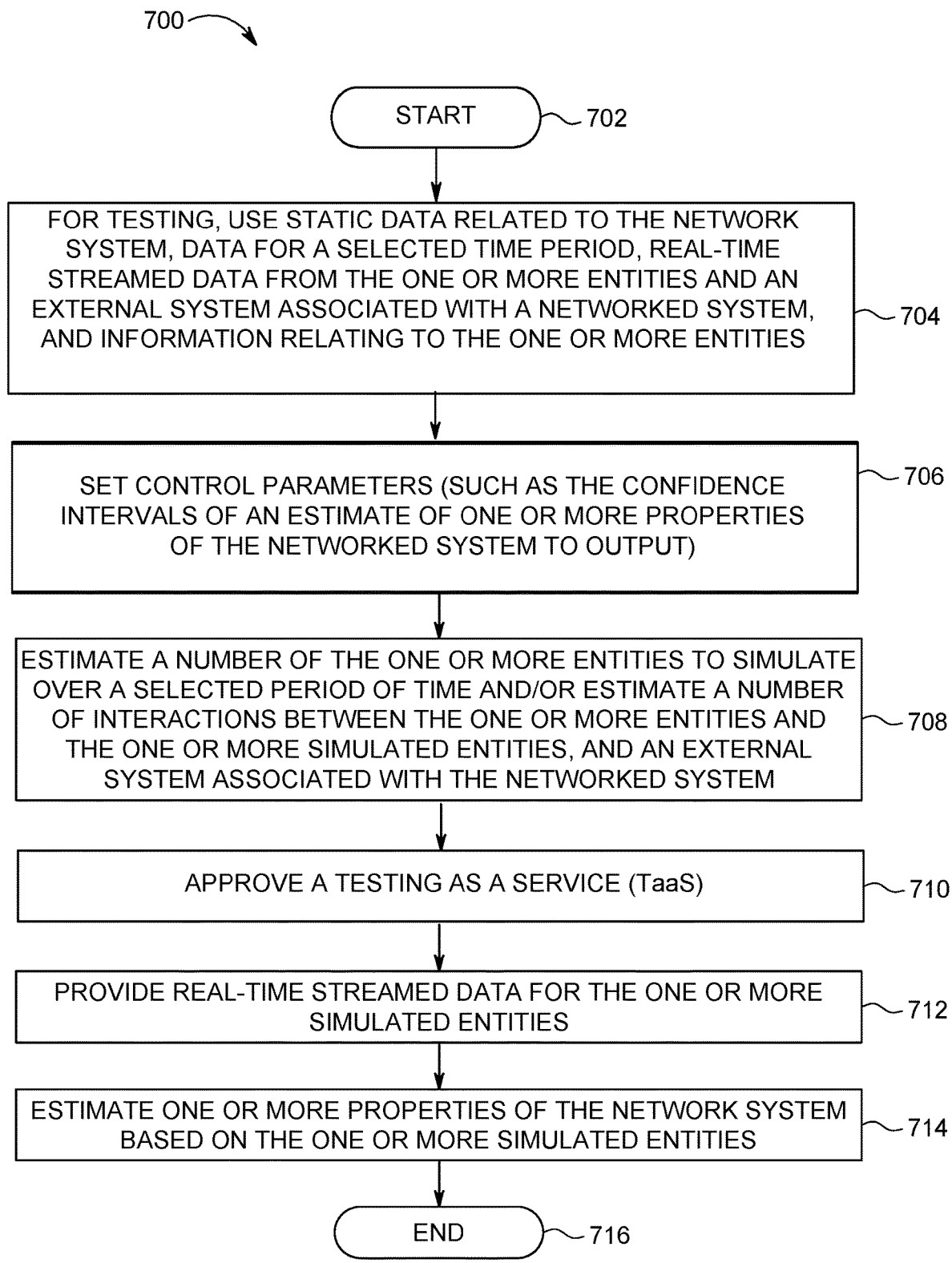
FIG. 7 is an additional flowchart diagram depicting an exemplary method for testing embedded systems and application in an Internet of Things (IoT) network environment using Hardware-in-the-Loop as a Service (HiLaaS), again in which various aspects of the present invention may be implemented.

Turning now to FIG. 7, an additional method 700 for testing embedded systems and application in an Internet of Things (IoT) network environment using Hardware-in-the-Loop as a Service (HiLaaS) by a processor is depicted. The functionality 700 may be implemented as a method executed as instructions on a machine, where the instructions are included on at least one computer readable medium or one non-transitory machine-readable storage medium. The functionality 700 may start in block 702. For testing simulation parameters, static data related to the network system, data for a selected time period, real-time streamed data from the one or more entities and an external system associated with a networked system, and information relating to the one or more entities may be used (and/or received as part of the simulation parameters), as in block 704. One or more control parameters (e.g., confidence intervals of an estimate of one or more properties of the networked system) may be set, as in block 706. A number of the one or more entities to simulate over a selected period of time may be estimated and/or a number of interactions between the one or more entities and the one or more simulated entities, and an external system associated with the networked system may be estimated, as in block 708. A TaaS may be approved (e.g., a price is estimated for the testing and the prices for the testing may be approved), as in block 710. Real-time streamed data for the one or more simulated entities may be provided, as in block 712. One or more properties of the network system may be estimated based on the one or more simulated entities, as in block 714. The functionality 700 may end, as in block 716.

In one aspect, in conjunction with and/or as part of at least one block of FIGS. 6-7, the operations of methods 600 or 700 may include each of the following. The operations of methods 600 or 700 may receive data related to the network system, receive scheduling data for a selected time period, receive real-time streamed data from the one or more entities, and/or receive information relating to a type of simulator to use for the testing. A HiLaaS interface may be used and/or accessed by the one or more entities, a user, or a combination thereof for accessing the simulated environment.

A number of the one or more entities may be estimated to simulate over a selected period of time. A number of interactions between the one or more entities, the one or more simulated entities, and an environment associated with the networked system may also be estimated.

The operations of methods 600 or 700 may provide real-time streamed data for the one or more entities based on the testing of the one or more simulated entities. The operations of methods 600 or 700 may simulate the one or more entities according to the simulation parameters, and/or update, in real-time, the simulation parameters during the simulating. Additionally, the operations of methods 600 or 700 may synchronize one or more operations of the one or more entities and the one or more simulated entities in the simulation environment.

Figure 8:
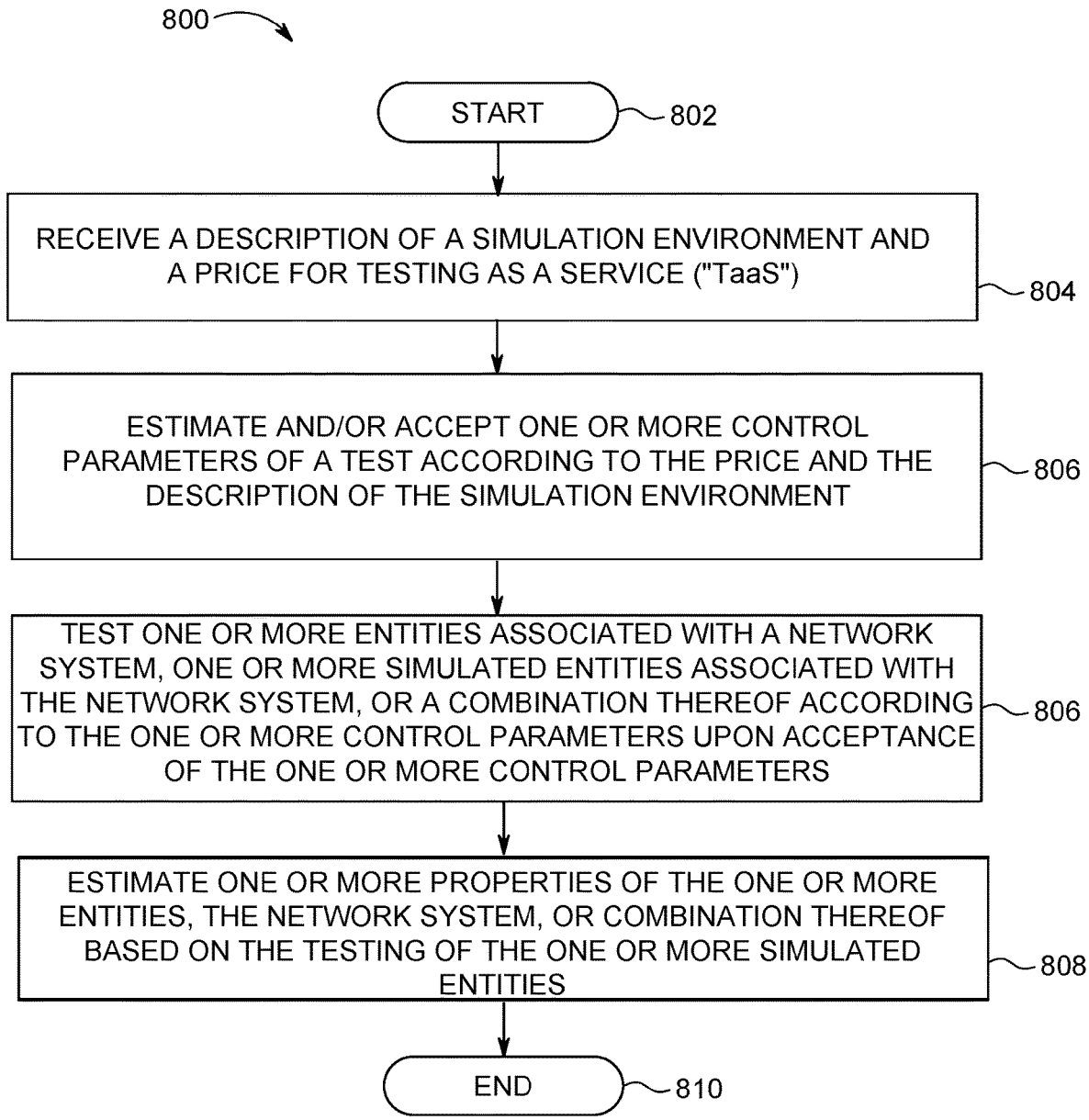
FIG. 8 is an additional flowchart diagram depicting an exemplary method for testing embedded systems and application in an IoT network environment using HiLaaS, in which various aspects of the present invention may be implemented.

Turning now to FIG. 8, a method 800 for testing embedded systems and application in an Internet of Things (IoT) network environment using a HiLaaS by a processor is depicted, in which various aspects of the illustrated embodiments may be implemented. The functionality 800 may be implemented as a method executed as instructions on a machine, where the instructions are included on at least one computer readable medium or one non-transitory machine-readable storage medium. The functionality 800 may start in block 802. A description of a simulation environment and price may be received, as in block 804. One or more control parameters of a test may be estimated according to the price and the description of the simulation environment, as in block 806. One or more entities in a network system, one or more simulated entities, or a combination thereof may be tested according to the one or more control parameters upon acceptance of the one or more control parameters, as in block 806. One or more properties of the one or more entities, the network system, or combination thereof may be estimated based on the testing of the one or more simulated entities, as in block 808. The functionality 800 may end, as in block 810.

Figure 9:
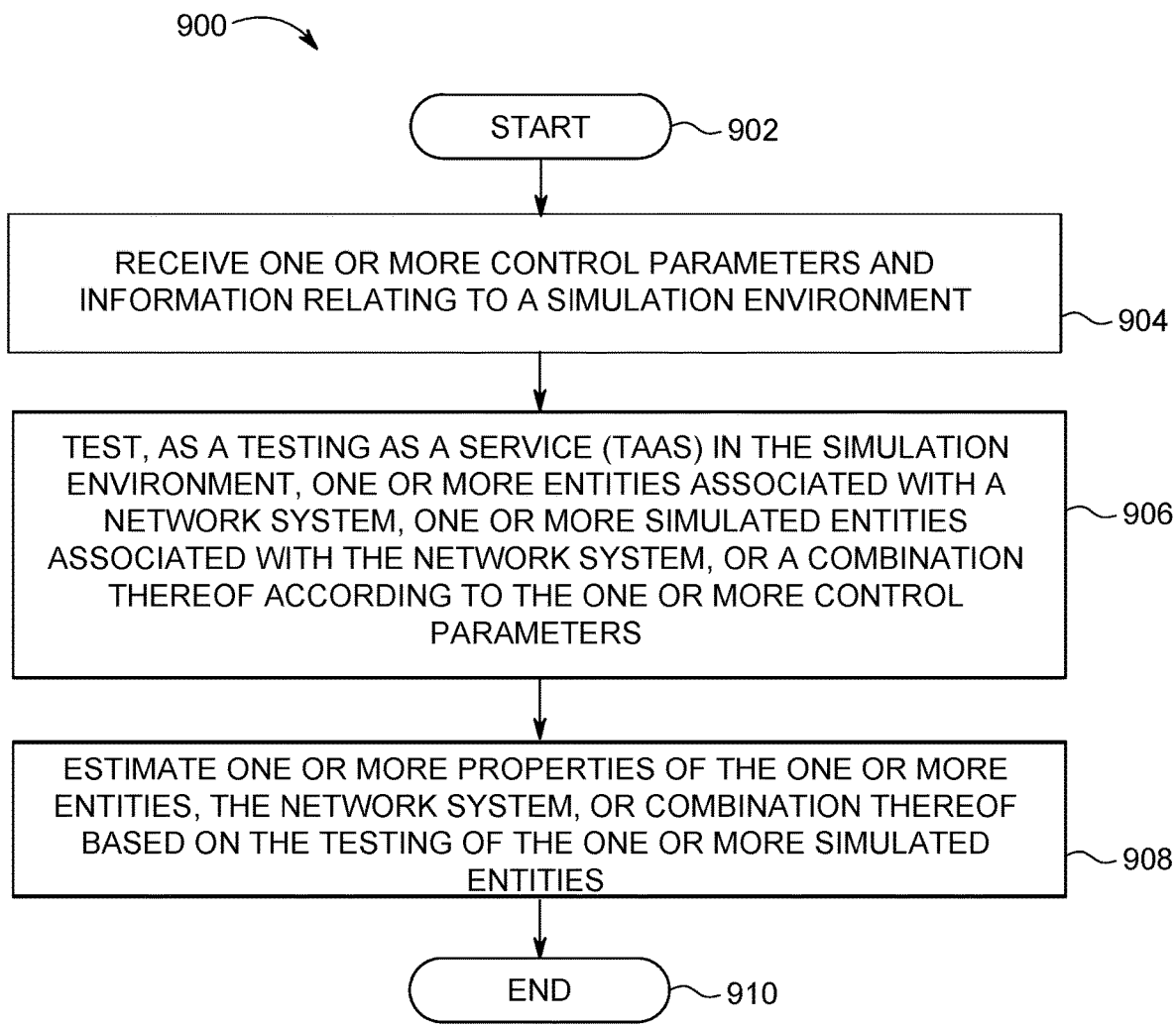
FIG. 9 is an additional flowchart diagram depicting an exemplary method for testing embedded systems and application in an IoT network environment using HiLaaS, again in which various aspects of the present invention may be implemented.

Turning now to FIG. 9, a method 900 for testing embedded systems and application in an Internet of Things (IoT) network environment using a HiLaaS by a processor is depicted. The functionality 900 may be implemented as a method executed as instructions on a machine, where the instructions are included on at least one computer readable medium or one non-transitory machine-readable storage medium. The functionality 900 may start in block 902. One or more control parameters and information relating to a simulation environment may be received, as in block 904. In the simulation environment, one or more entities associated with a network system, one or more simulated entities associated with the network system, or a combination thereof may be tested, as a testing as a service ("TaaS" such as, for example, the HiLaaS), according to the one or more control parameters, as in block 906. One or more properties of the one or more entities, the network system, or combination thereof may be estimated based on the testing of the one or more simulated entities, as in block 908. The functionality 900 may end, as in block 910.

In one aspect, in conjunction with and/or as part of at least one block of FIGS. 8-9, the operations of methods 800 or 900 may include each of the following. The methods 800 or 900 may estimate a price for testing in the simulation environment according to the one or more control parameters; receive an approval of the estimated price for the testing; and/or test the one or more entities, the one or more simulated entities, or a combination thereof. Moreover, the methods 800 or 900 may receive a maximum threshold price, a range of pricing, or a combination thereof for testing in the simulation environment; adjust one or more control parameters according to the maximum threshold price, the range of pricing, or a combination thereof for testing in the simulation environment; receive an approval of the adjusted control; and/or test the one or more entities, the one or more simulated entities, or a combination thereof.

Pursuant to receiving the one or more control parameters and the information relating to the simulation environment, the methods 800 or 900 may receive a description of the simulation environment, receive a description of the network system, wherein the description includes at least a topology of the network system, receive historical data related to operations of the network system, receive scheduling data for a selected time period of the operations of the network system, receive real-time streamed data from the one or more entities, receive real-time streamed data from one or more third-parties, wherein the streamed data may include weather monitoring data, pollution monitoring data, satellite imagery data, or aerial imagery data, or a combination thereof (and/or other data provided by a third party), receive a selected time to perform the testing and provide testing results, receive one or more conditions for the testing the one or more simulated entities, receive one or more conditions for the testing the one or more entities of the system under test, and/or receive a measure of accuracy of the testing.

The methods 800 or 900 may estimate a number of the one or more entities to simulate over a selected period of time according to the one or more control parameters, estimate a number of interactions between the one or more entities, the one or more simulated entities, and an environment associated with the networked system according to the one or more control parameters, and/or estimate one or more computing systems needed to simulate the one or more entities and the number of interactions over a selected time period according to the one or more control parameters.

The methods 800 or 900 may simulate the one or more entities according to the control parameters, update the simulation environment in real-time during the simulating, wherein the updating includes at least historical data of operations of the network system, and/or provide real-time streamed data for the one or more simulated entities as output of testing of the one or more simulated entities. The methods 800 or 900 may provide an interface for remote access by the one or more entities, a user, or a combination thereof for accessing the simulated environment.

The methods 800 or 900 may receive a description of a simulation environment and price; estimate the one or more control parameters of a test according to the price and the description of a simulation environment; test the one or more entities associated, the one or more simulated entities, or a combination thereof according to the control parameters upon acceptance of the one or more control parameters; and/or estimate the one or more properties of the one or more entities, the network system, or combination thereof based on the testing of the one or more simulated entities.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowcharts and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowcharts and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowcharts and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts or carries out combinations of special purpose hardware and computer instructions.

The invention claimed is:

1. A method, by a processor, for testing networked systems in an Internet of Things (IoT) environment, comprising:
receiving one or more control parameters and information relating to a simulation environment;
testing, as a testing as a service (TaaS) in the simulation environment, one or more entities associated with a network system and one or more simulated entities associated with the network system according to the one or more control parameters, wherein a number of the one or more simulated entities under test is determined and adjusted in real-time according to test data received from the one or more entities comprising actual entities such that contextual and temporal information associated with a physical environment maintaining the one or more entities is used to modify the number of the one or more simulated entities under test, and wherein the number of the one or more simulated entities under test is different than a number of the one or more entities of the network system; and
estimating one or more properties of the one or more entities and the network system based on the testing of the one or more simulated entities such that test data from the one or more simulated entities is assimilated with the test data from the one or more entities associated with the network system to determine the estimation.

2. The method of claim 1, wherein testing as the TaaS in the simulation environment further includes:
estimating a price for testing in the simulation environment according to the one or more control parameters; or
receiving an approval of the estimated price for the testing.

3. The method of claim 1, wherein testing as the TaaS in the simulation environment further includes:
receiving a maximum threshold price, a range of pricing, or a combination thereof for testing in the simulation environment;
adjusting one or more control parameters according to the maximum threshold price, the range of pricing, or a combination thereof for testing in the simulation environment; or
receiving an approval of the adjusted control.

4. The method of claim 1, wherein receiving the one or more control parameters and the information relating to the simulation environment includes:
receiving a description of the simulation environment;
receiving a description of the network system, wherein the description includes at least a topology of the network system;
receiving historical data related to operations of the network system;
receiving scheduling data for a selected time period of the operations of the network system;
receiving real-time streamed data from the one or more entities; or
receiving real-time streamed data from one or more third-parties.

5. The method of claim 1, wherein receiving the one or more control parameters further includes:
receiving a selected time to perform the testing and provide testing results;
receiving one or more conditions for the testing the one or more simulated entities;
receiving one or more conditions for the testing the one or more entities of the system under test; or
receiving a measure of accuracy of the testing.

6. The method of claim 1, further including prior to testing as the TaaS in the simulation environment:
estimating a number of the one or more entities to simulate over a selected period of time according to the one or more control parameters;
estimating a number of interactions between the one or more entities, the one or more simulated entities, and an environment associated with the networked system according to the one or more control parameters; or
estimating one or more computing systems needed to simulate the one or more entities and the number of interactions over a selected time period according to the one or more control parameters.

7. The method of claim 1, wherein the testing further includes:
simulating the one or more entities according to the control parameters; and
updating the simulation environment in real-time during the simulating, wherein the updating includes at least historical data of operations of the network system.

8. The method of claim 1, further including providing real-time streamed data for the one or more simulated entities as output of the testing of the one or more simulated entities.

9. The method of claim 1, further including providing an interface for remote access by the one or more entities, a user, or a combination thereof for accessing the simulated environment.

10. The method of claim 1, further including:
receiving a description of a simulation environment and price;
estimating the one or more control parameters of a test according to the price and the description of a simulation environment;
testing the one or more entities associated, the one or more simulated entities, or a combination thereof according to the control parameters upon acceptance of the one or more control parameters; and
estimating the one or more properties of the one or more entities, the network system, or combination thereof based on the testing of the one or more simulated entities.

11. A system for testing networked systems in an Internet of Things (IoT) network environment, comprising:
one or more computers with executable instructions that when executed cause the system to:
receive one or more control parameters and information relating to a simulation environment;
test, as a testing as a service (TaaS) in the simulation environment, one or more entities associated with a network system and one or more simulated entities associated with the network system according to the one or more control parameters, wherein a number of the one or more simulated entities under test is determined and adjusted in real-time according to test data received from the one or more entities comprising actual entities such that contextual and temporal information associated with a physical environment maintaining the one or more entities is used to modify the number of the one or more simulated entities under test, and wherein the number of the one or more simulated entities under test is different than a number of the one or more entities of the network system; and estimate one or more properties of the one or more entities and the network system based on the testing of the one or more simulated entities such that test data from the one or more simulated entities is assimilated with the test data from the one or more entities associated with the network system to determine the estimation.

12. The system of claim 11, wherein the executable instructions that when executed cause the system to:
estimate a price for testing in the simulation environment according to the one or more control parameters;
receive an approval of the estimated price for the testing;
receive a maximum threshold price, a range of pricing, or a combination thereof for testing in the simulation environment;
adjust one or more control parameters according to the maximum threshold price, the range of pricing, or a combination thereof for testing in the simulation environment; or
receive an approval of the adjusted control.

13. The system of claim 11, wherein, pursuant to receiving the one or more control parameters and the information relating to the simulation environment, the executable instructions that when executed cause the system to:
receive a description of the simulation environment;
receive a description of the network system, wherein the description includes at least a topology of the network system;
receive historical data related to operations of the network system;
receive scheduling data for a selected time period of the operations of the network system;
receive real-time streamed data from the one or more entities;
receive real-time streamed data from one or more third-parties, wherein the streamed data includes weather monitoring data, pollution monitoring data, satellite imagery data, or aerial imagery data, or a combination thereof;
receive a selected time to perform the testing and provide testing results;
receive one or more conditions for the testing the one or more simulated entities;
receive one or more conditions for the testing the one or more entities of the system under test; or
receive a measure of accuracy of the testing.

14. The system of claim 11, wherein the executable instructions that when executed cause the system to:
estimate a number of the one or more entities to simulate over a selected period of time according to the one or more control parameters;
estimate a number of interactions between the one or more entities, the one or more simulated entities, and an environment associated with the networked system according to the one or more control parameters; or
estimate one or more computing systems needed to simulate the one or more entities and the number of interactions over a selected time period according to the one or more control parameters.

15. The system of claim 11, wherein the executable instructions that when executed cause the system to:
simulate the one or more entities according to the control parameters;
update the simulation environment in real-time during the simulating, wherein the updating includes at least historical data of operations of the network system; or
provide real-time streamed data for the one or more simulated entities as output of testing of the one or more simulated entities.

16. The system of claim 11, wherein the executable instructions that when executed cause the system to provide an interface for remote access by the one or more entities, a user, or a combination thereof for accessing the simulated environment.

17. The system of claim 11, wherein the executable instructions that when executed cause the system to:
receive a description of a simulation environment and price;
estimate the one or more control parameters of a test according to the price and the description of a simulation environment;
test the one or more entities associated, the one or more simulated entities, or a combination thereof according to the control parameters upon acceptance of the one or more control parameters; and
estimate the one or more properties of the one or more entities, the network system, or combination thereof based on the testing of the one or more simulated entities.

18. A computer program product for, by a processor, testing networked systems in a computing environment, the computer program product comprising a non-transitory computer-readable storage medium having computer-readable program code portions stored therein, the computer-readable program code portions comprising:
an executable portion that receives one or more control parameters and information relating to a simulation environment;
an executable portion that tests, as a testing as a service (TaaS) in the simulation environment, one or more entities associated with a network system and one or more simulated entities associated with the network system according to the one or more control parameters, wherein a number of the one or more simulated entities under test is determined and adjusted in real-time according to test data received from the one or more entities comprising actual entities such that contextual and temporal information associated with a physical environment maintaining the one or more entities is used to modify the number of the one or more simulated entities under test, and wherein the number of the one or more simulated entities under test is different than a number of the one or more entities of the network system; and
an executable portion that estimates one or more properties of the one or more entities and the network system based on the testing of the one or more simulated entities such that test data from the one or more simulated entities is assimilated with the test data from the one or more entities associated with the network system to determine the estimation.

19. The computer program product of claim 18, wherein the executable portion that tests as the TaaS in the simulation environment further:
estimates a price for testing in the simulation environment according to the one or more control parameters;
receives an approval of the estimated price for the testing;
receives a maximum threshold price, a range of pricing, or a combination thereof for testing in the simulation environment;

adjusts one or more control parameters according to the maximum threshold price, the range of pricing, or a combination thereof for testing in the simulation environment; or receives an approval of the adjusted control.

20. The computer program product of claim 18, further including an executable portion that:

receives a description of the simulation environment;

receives a description of the network system, wherein the description includes at least a topology of the network system;

receives historical data related to operations of the network system;

receiving scheduling data for a selected time period of the operations of the network system;

receives real-time streamed data from the one or more entities;

receives real-time streamed data from one or more third-parties, wherein the streamed data includes weather monitoring data, pollution monitoring data, satellite imagery data, or aerial imagery data, or a combination thereof;

receives a selected time to perform the testing and provide testing results;

receives one or more conditions for the testing the one or more simulated entities;

receives one or more conditions for the testing the one or more entities of the system under test; or receives a measure of accuracy of the testing.

21. The computer program product of claim 18, further including an executable portion that:

estimates a number of the one or more entities to simulate over a selected period of time according to the one or more control parameters;

estimates a number of interactions between the one or more entities, the one or more simulated entities, and an environment associated with the networked system according to the one or more control parameters; or estimates one or more computing systems needed to simulate the one or more entities and the number of interactions over a selected time period according to the one or more control parameters.

22. The computer program product of claim 18, further including an executable portion that:

simulates the one or more entities according to the control parameters;

updates the simulation environment in real-time during the simulating, wherein the updating includes at least historical data of operations of the network system; or provides real-time streamed data for the one or more simulated entities as output of testing of the one or more simulated entities.

23. The computer program product of claim 18, further including an executable portion that provides an interface for remote access by the one or more entities, a user, or a combination thereof for accessing the simulated environment.

24. The computer program product of claim 18, further including an executable portion that:

receives a description of a simulation environment and price;

estimates the one or more control parameters of a test according to the price and the description of a simulation environment;

tests the one or more entities associated, the one or more simulated entities, or a combination thereof according to the control parameters upon acceptance of the one or more control parameters; and estimates the one or more properties of the one or more entities, the network system, or combination thereof based on the testing of the one or more simulated entities.

* * * * *